United States Patent [19]
Van Brunt et al.

[11] Patent Number: 5,384,808
[45] Date of Patent: Jan. 24, 1995

[54] METHOD AND APPARATUS FOR TRANSMITTING NRZ DATA SIGNALS ACROSS AN ISOLATION BARRIER DISPOSED IN AN INTERFACE BETWEEN ADJACENT DEVICES ON A BUS

[75] Inventors: Roger Van Brunt, San Francisco; Florin Oprescu, Sunnyvale, both of Calif.

[73] Assignee: Apple Computer, Inc., Cupertino, Calif.

[21] Appl. No.: 999,155

[22] Filed: Dec. 31, 1992

[51] Int. Cl.$^6$ .................. H04B 3/00; H04L 25/00
[52] U.S. Cl. ........................ 375/36; 326/56; 341/68
[58] Field of Search .............. 375/106, 36, 28; 307/473; 341/68, 69

[56] References Cited

U.S. PATENT DOCUMENTS 4,227,045 10/1980 Chelcun et al. ............... 375/28
5,160,929 11/1992 Costello ........................ 341/375

FOREIGN PATENT DOCUMENTS 0299639 1/1989 European Pat. Off. .......... 5/25
0474185 3/1992 European Pat. Off. .......... 5/25

OTHER PUBLICATIONS

M. Tenner, "A bus on a diet—the serial bus alternative—an introduction to the P1394 High Performance Serial Bus," Compcom Spring 1992, 24–28 Feb. 1992 37 IEEE Computer Society International Conf. (Cat. No. 92CH3098-1) pp. 316–321.
IBM Technical Disclosure Bulletin; "On-Chip Implementation of a CMOS Duo-Binary Encder", Jan. 1990, vol. 32, No. 8A.

Primary Examiner—Stephen Chin
Assistant Examiner—Bryan Webster
Attorney, Agent, or Firm—Blakely, Sokoloff, Taylor & Zafman

[57] ABSTRACT

The present invention provides a method and apparatus for transmitting NRZ data signals across an interface comprising an isolation barrier disposed between two devices interconnected via a bus. The apparatus comprises a signal differentiator for receiving an NRZ data signal and outputting a differentiated signal. A driver comprising a tri-state gate has as a first input the data signal and as a second input the differentiated signal for enabling the tri-state gate when the differentiated signal is high. A bias voltage is applied to an output of the tri-state gate to derive as output a transmission signal for transmission via the bus across the interface between the two devices. In this way, the transmission signal output from the first device comprises an intermediate transmission signal corresponding to the bias voltage when the tri-state gate is disabled, a high transmission signal when the tri-state gate is enabled and the first input to the tri-state gate is high, and a low transmission signal when the tri-state gate is enabled and the first input to the tri-state gate is low. A Schmidt trigger is provided as a receiver in the second device for receiving as input the transmission signal and outputting a reconstituted data signal corresponding to the synchronized data signal.

7 Claims, 5 Drawing Sheets

METHOD AND APPARATUS FOR TRANSMITTING NRZ DATA SIGNALS ACROSS AN ISOLATION BARRIER DISPOSED IN AN INTERFACE BETWEEN ADJACENT DEVICES ON A BUS

BACKGROUND OF THE INVENTION

Field of the Invention

The present invention relates to a bus architecture communications scheme for enabling communications between a plurality nodes or devices in a computer system. More particularly, the present invention relates to an interface between two devices connected via the bus in which binary signals in the form of NRZ data signals are transmitted through an isolation barrier disposed between the two devices.

Computer devices within a given computer system, such as a microprocessor, a disk drive, a CRT, a printer and the like, need the ability to convey signals between themselves. In the electronics and computer fields, this has been accomplished by means of a bus which comprises a plurality of transmission wires and acts as a communications path for interconnecting several devices in the system. Each device of the system need only plug into the bus to be theoretically connected to each of the other devices in the system. In order to communicate with other devices attached to the bus, each must be equipped with hardware such as transmitting and receiving circuitry compatible with the communications protocol implemented for the bus. However, due to the small signal voltages and currents driven on the bus by each of the above-circuits, a means of electrical or galvanic isolation must be implemented between the circuits. This isolation reduces system ground loop currents and prevents ground drops from interfering with the signal transmission. In conventional bus architectures, one way to electrically isolate the circuitries connected to the bus is to place a pulse transformer in a module at the end of a cable (comprising the bus) to be attached to an associated device.

However, a major drawback in the use of a pulse transformer implemented as the isolation barrier is that it acts as a high pass filter due to the fact that pulse transformers only AC couple the input to the output. If the transmitter drives a high signal on the bus for a prolonged period, the signal as seen by the receiver begins to fall due to the high pass filtering. Hence, not all the data in a broad band spectrum NRZ data signal is transmitted through the narrow band channel created by the pulse transformer because of the unrecoverable loss of the lower band data.

Currently, there are several techniques of passing broad band NRZ data signals through a narrow band channel. One such technique consists of analog and digital modulation wherein a carrier wave is used to transmit broad band data on a specific frequency. However, this technique is relatively complicated, requiring a significant amount of hardware which increases costs and generally requires circuits not available in standard cell gate array technology.

Another prior art transmission technique provides for encoding of the NRZ data signal at the transmitting end of the cable and decoding of the data signal at the receiving end of the cable. This is typically performed by Manchester, 4B5B, 8B10B, etc. encoding of the data signal in which a balanced code is maintained so as to provide an essentially constant DC level. For example, Manchester is a bit level balanced code in which the DC level from bit to bit does not change, while 4B5B and 8B10B are byte level balanced codes in which the DC level of a byte changes by less than 10 to 20%. However, such encoding techniques increase the bandwidth of the NRZ data signal. As an example, when a 50 Megabit Manchester encoded signal is transmitted across the isolation barrier, the bandwidth of the signal is in the range of 20 to 50 MHz rather than the original NRZ spectrum of DC to 25 MHz. Furthermore, a significant amount of electronic hardware is required to implement these coding techniques, thereby increasing the cost and reducing the performance (i.e. higher bit error rates) of the overall bus architecture.

In addition to the foregoing, another drawback in the use of prior art transmission methods and apparatus is that they are based upon typical bus architecture schemes, such as SCSI, Ethernet and ADB, which do not provide for multi-speed signal transmissions on an upward compatible bus where the capabilities of faster devices connected to such a multi-speed bus can be realized.

Accordingly, it is an object of the present invention to provide a method and apparatus for the transmission of NRZ data signals across an isolation barrier disposed between adjacent devices on a bus.

Another object of the present invention is to provide a method and apparatus for transmitting broad band NRZ data signals across a pulse transformer type isolation barrier having a narrow band channel.

A further object of the present invention is to implement the method and apparatus of the present invention in a multi-speed bus architecture scheme using digital standard cell or gate array technology so as to transmit NRZ data signals across a bi-directional interface between adjacent devices coupled to the bus.

BRIEF SUMMARY OF THE INVENTION

The present invention provides a method and apparatus for the transmission of data signals across an interface comprising an isolation barrier disposed between first and second devices connected via a bus. The isolation barrier may comprise a pulse transformer, a capacitative coupling or the like for electrically isolating the transmitting and receiving circuitry of the devices and to prevent ground loops therebetween.

In the first device, an NRZ input data signal is supplied to a data synchronizer for synchronizing the data signal with a clock signal also input to the data synchronizer. The synchronized data signal derived therefrom is supplied along with the clock signal to a differentiator for differentiating the pulses of the data signal and outputting a delayed data signal which is next supplied as input to a driver consisting of a tri-state gate.

The tri-state gate also receives as a second (control) input the digitally differentiated signal which enables the gate when high and disables the gate when low. A bias voltage is applied to the output of the tri-state gate to maintain the output of the gate at an intermediate state when the gate is disabled. When the differentiated signal goes high, the gate is enabled, in which case, if the synchronized data signal is also high, a high transmission signal as the output of the gate is driven onto the bus. If the gate is enabled and the input synchronized data signal goes low, then a low transmission signal is driven onto the bus. In this manner, the transmitter circuitry of the first device converts the NRZ input data signal into a DC balanced transmission signal that can be effectively transmitted across the isolation barrier.

A Schmidt trigger is provided as the receiver of the second device and comprises two threshold voltages centered around the bias voltage. The Schmidt trigger receivers the signal transmitted across the isolation barrier and outputs a series of high and low transitions which in effect reconstitutes the synchronized data signal.

In addition to the foregoing description, another embodiment of the present invention is designed specifically for implementation with the multi-speed bus architecture scheme described in IEEE Standards Document P1394 entitled "High Performance Serial Bus". The multi-speed serial bus comprising a twisted pair cable is provided for universal interconnection between computer devices arbitrarily configured on the bus. In this embodiment, the interface of the present invention comprising the isolation barrier is implemented between physical interface chip and the link layer chip of the bus architecture scheme set forth in the P1394 standard. The method and apparatus of the present invention is implemented between the two chips so as to provide a simple method using digital standard cell or gate array technology in a standard digital CMOS process to pass the NRZ data signals across the isolation barrier disposed between the two chips.

BRIEF DESCRIPTION OF THE DRAWINGS

The objects, features and advantages of the present invention will become apparent from the following detailed description of the preferred embodiment in which.

DETAILED DESCRIPTION OF THE INVENTION

The present invention relates to a method and apparatus for the transmission of data signals across an interface comprising an isolation barrier disposed between adjacent devices connected via a bus. In the following description, numerous details are set forth such as voltages, currents, device types, etc., in order to provide a thorough understanding of the present invention. It will be obvious, however, to one skilled in the art that these details are not required to practice the present invention. In other instances, well-known circuits, methods and the like are not set forth in detail in order to avoid unnecessarily obscuring the present invention.

Figure 1:
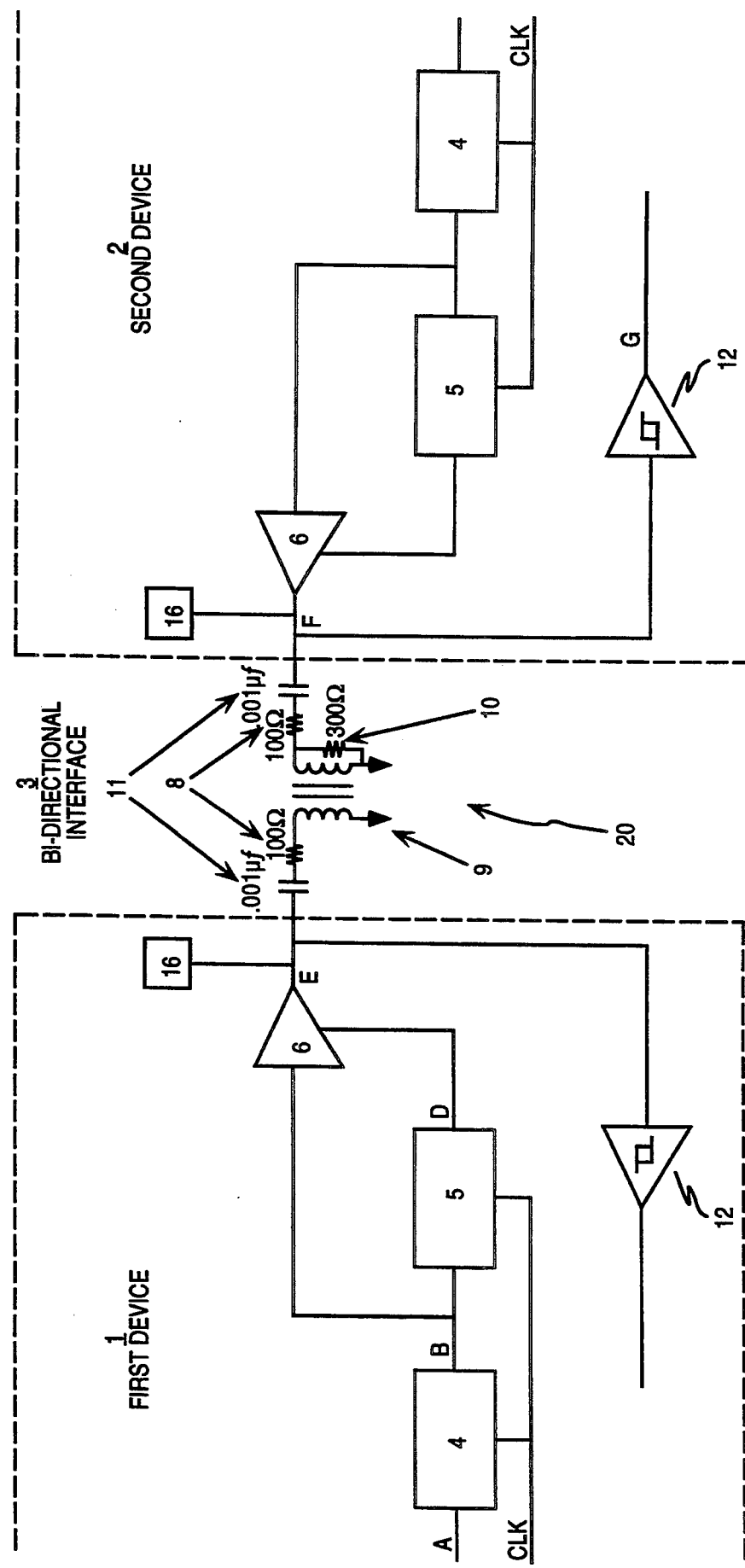
FIG. 1 is a block diagram of the transceiver circuits for each device of the present invention showing the interconnection between the devices across the isolation barrier of the interface.
Figure 2:
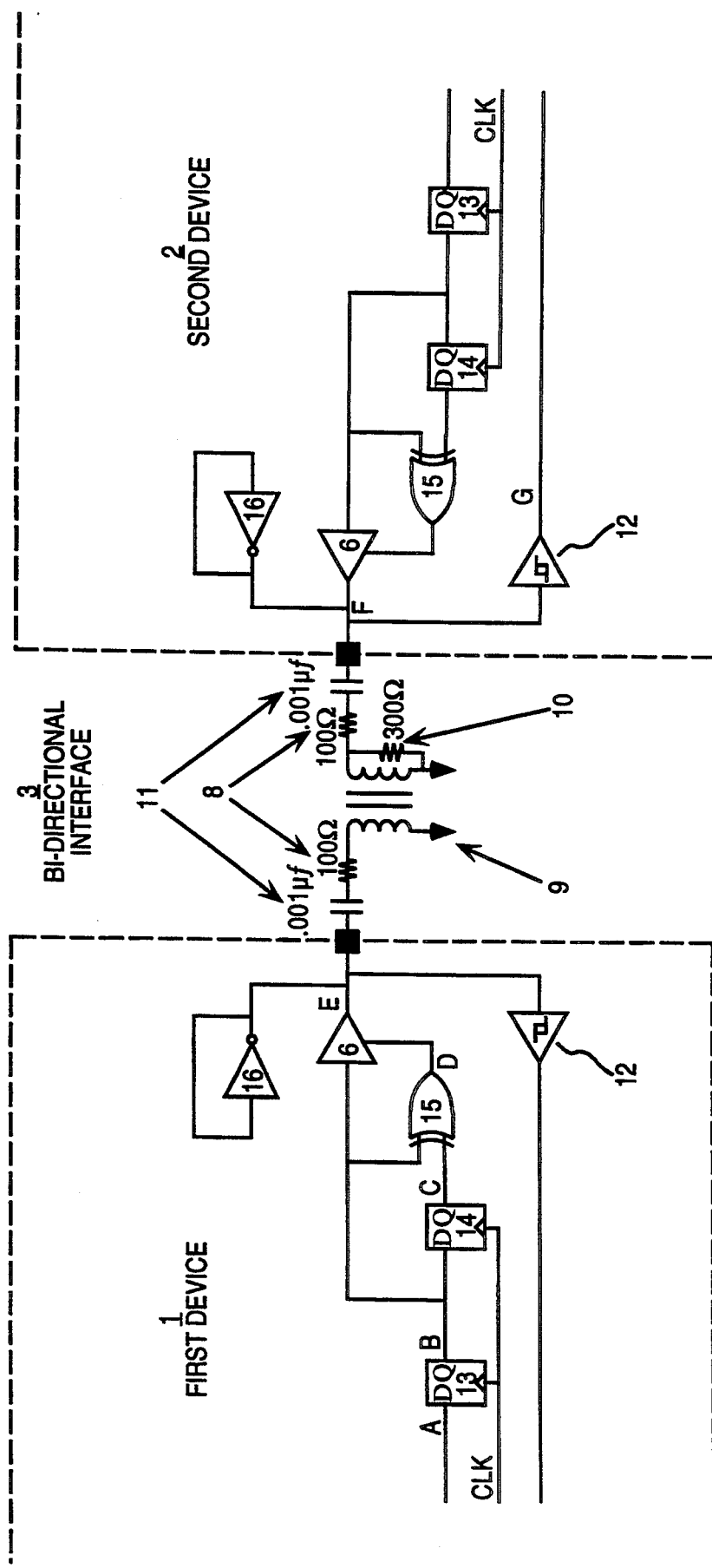
FIG. 2 is a detailed circuit diagram of the present invention showing the use of a pulse transformer as the isolation barrier.

With reference to FIGS. 1 and 2, the present invention comprises a first device 1 and a second device 2 interconnected across an interface 3 by means of a bus 20. The bus 20 comprises at least one transmission line 21 for transmitting data and control signals and further comprises an isolation barrier 9 coupled to the transmission lines 21 for electrically isolating the transmitting and receiving circuitry of the two devices 1 and 2 to prevent ground loops therebetween. Blocking capacitors 11 of approximately 0.001 $\mu f$ are coupled to the transmission lines 21 of the bus 20 on each side of the isolation barrier 9 to prevent DC current from being supplied to the isolation barrier 9. In addition, as shown in FIGS. 1 and 2, three resistors, two series resistors 8 of approximately 100$\Omega$ and a third shunt resistor 10 of approximately 300$\Omega$ (which is connected to ground to shunt the pulse transformer 9), are further coupled to the transmission lines 21 of the bus 20. The series resistors 8 are disposed on respective sides of the isolation barrier 9 to provide signal voltage attenuation and current limiting in order to protect the input diodes (not shown) of each device 1 and 2. The shunt resistor 10 determines the amount of voltage attenuation and acts to help discharge the pin capacitance of each device 1 and 2 when their drivers 6 are tri-stated. The values for the components described above have been chosen for transmission rates on the bus of approximately 50 Megabits/second so that for different transmission rates, these values would have to be modified as is well-known in the art.

Figure 3:
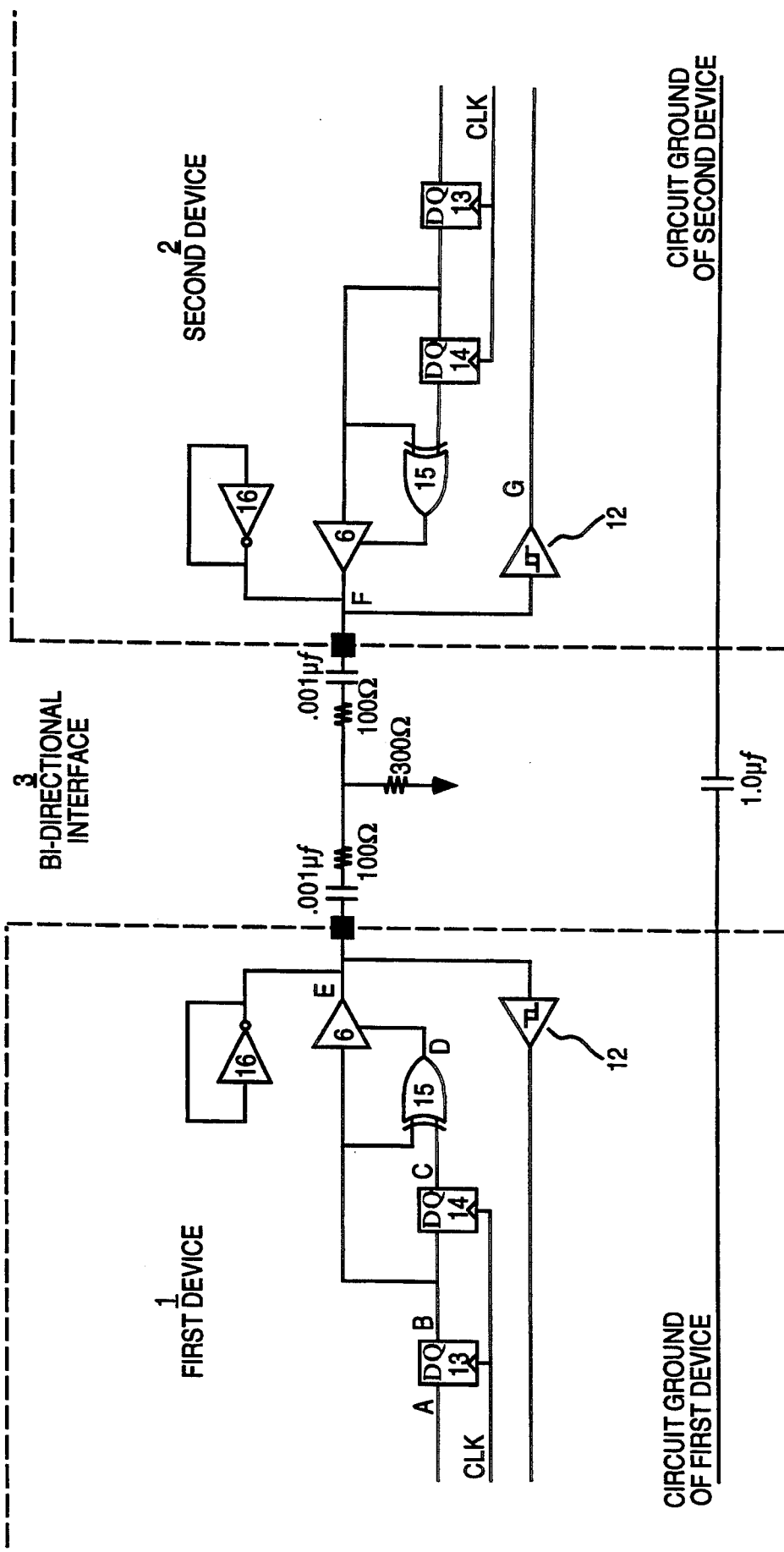
FIG. 3 is a detailed circuit diagram of the present invention showing the use of a capacitative coupling as the isolation barrier.

According to one embodiment of the present invention, the interface 3 between the devices is half duplex, bi-directional such that each device 1 and 2 comprises a transceiver having a transmitter or driver 6 consisting of a tri-state gate and a receiver 12 consisting of a Schmidt trigger. Furthermore, according to this embodiment, the isolation barrier 9 comprises a pulse transformer 9 (of 80 $\mu H$) for galvanic isolation of the circuitry of each device 1 and 2 as is well-known in the art. In the following description, the method and apparatus of the present invention will be explained in terms of the transmitter 6 of the first device 1 transmitting the transmission signal to the receiver 12 of the second device 2 where it is reconstituted into the original data signal input to the circuitry of the first device 1. Due to the bi-directional nature of the interface 3, the configuration of elements and their operation are identical for each device. However, the present invention is applicable to uni-directional interfaces 3 and to isolation barriers 9 other than pulse transformers 9 and capacitative couplings (shown in FIG. 3).

In the first device 1, an NRZ input data signal A having digital high and low values is generated from a memory read, a peripheral input device or the like. As shown in FIG. 1 and more specifically in FIG. 2, this data signal A is supplied to a data synchronizer 4 consisting of a first D-Q flip-flop 13 for synchronizing the data signal A with a clock signal also input to the first D-Q flip flop 13. The synchronized data signal B derived therefrom is supplied along with the clock signal to a digital differentiator 5 for differentiating the pulses of the data signal A. As shown in FIG. 2, the digital differentiator 5 may comprise a second flip-flop 14 for receiving the synchronized data signal B and the clock signal and outputting a delayed data signal C. This delayed data signal C is next supplied as input along with the synchronized data signal B to an exclusive OR gate 15. With reference to the signals B and C shown in the timing chart of FIG. 3, the exclusive OR gate 15 senses both the positive and negative transitions of the pulses in the synchronized data signal B and outputs as the digitally differentiated signal D a series of pulses corresponding to these transitions.

Now referring to both FIGS. 1 and 2, the synchronized data signal B is supplied as a first (data) input to a transmitter 6 or driver 6 consisting of a tri-state gate 6. The tri-state gate 6 also receives as a second (control) input the digitally differentiated signal D which enables the gate 6 when high and disables the gate when low. A bias voltage 16 is applied to the output of the tri-state gate 6 to maintain the output of the gate 6 at an intermediate state of approximately 2.5 volts when the gate 6 is disabled. As shown in FIG. 2, the bias voltage 16 is generated by a tied back inverter 16, which in some instances, may require two pins in order to connect the input to the output. It is also permissible to set the bias voltage 16 used in the present invention in other ways, such as with an external resistor voltage divider having 5KΩ resistors.

When the gate 6 is disabled, a first intermediate transmission signal E as the output of the gate 6 is driven on the bus 20 and transmitted across the isolation barrier 9. When the digitally differentiated signal D goes high, the gate 6 is then enabled, in which case, if the synchronized data signal B is also high, a first high transmission signal E as the output of the gate 6 is driven onto the bus. This first high transmission signal E comprises a high state of approximately 5 volts. However, if the gate 6 is enabled and the input synchronized data signal B goes low, then a first low transmission signal E is driven onto the bus 20. This first low transmission signal E comprises a low state of approximately 0 volts. Therefore, the transmitter circuitry of the first device 1 converts the NRZ input data signal A into a DC balanced transmission signal E (without increasing the signal's high frequency bandwidth) that can be effectively transmitted across the isolation barrier 9. As would be obvious to one skilled in the art, the foregoing signal amplitudes may vary (i.e., higher or lower) depending upon the specific bias voltage 16 utilized and the specifications of the particular electronic components also used.

Figure 4:
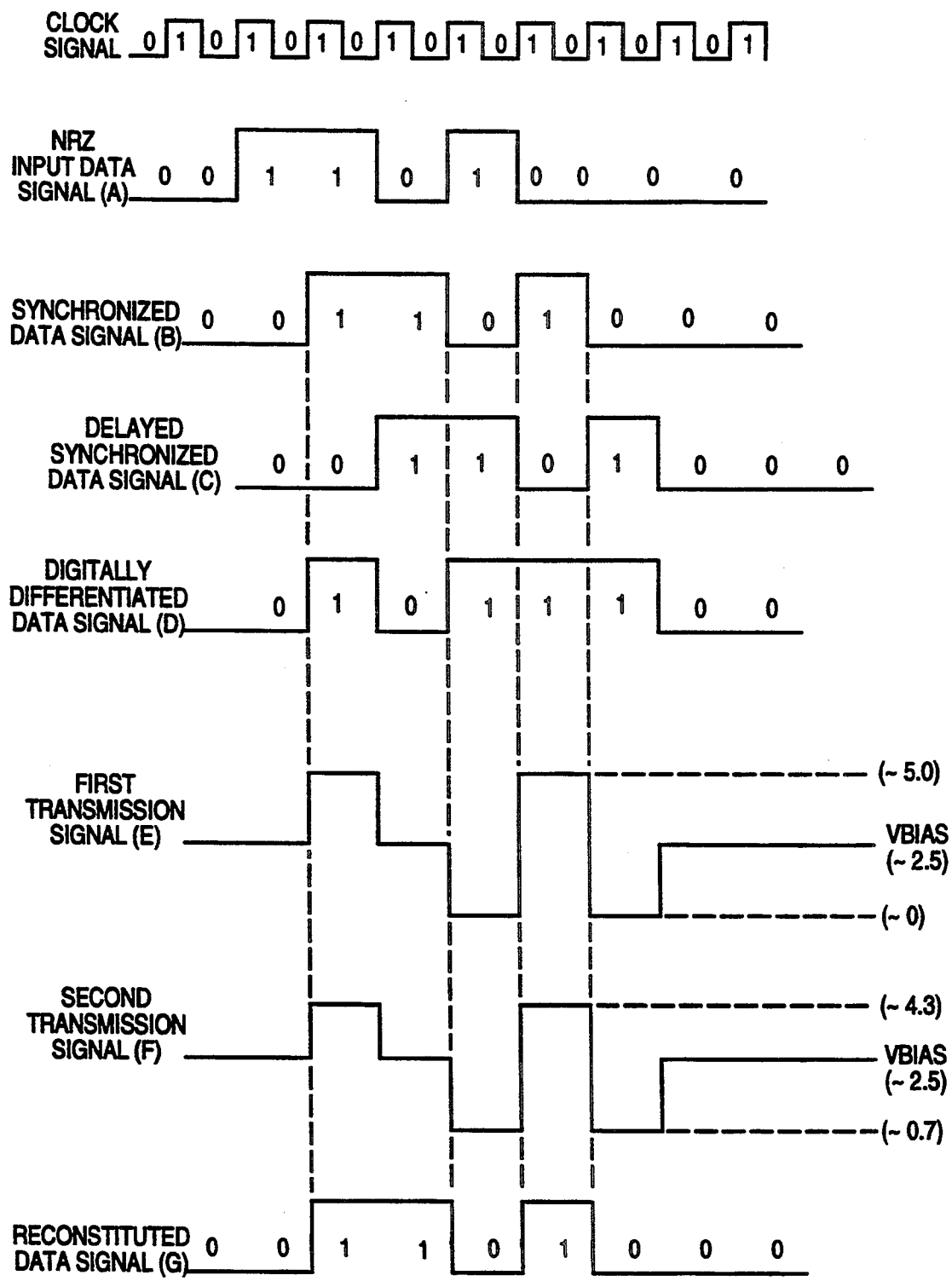
FIG. 4 is a timing chart diagram for describing the operation of the circuits of the present invention.

When the first transmission signal E is driven onto the bus, it is received as 0 volt DC input to the pulse transformer 9. The transformer 9 magnetically couples this signal to the bus 20 on the opposite side adjacent to the second device 2 where the output is a second transmission signal F. As can be seen from the timing chart of FIG. 4, the second transmission signal F is substantially the same as the first transmission signal E except that it varies in amplitude therefrom. This second transmission signal F is then received as input to a receiver 12 of the second device 2 consisting of a Schmidt trigger 12. The Schmidt trigger 12 reconstitutes the non-return to zero data of the second transmission signal F into the digital pulses of the synchronized data signal B originally received as input to the digital differentiator 5.

The Schmidt trigger 12 comprises two threshold voltages centered around the bias voltage 16, preferably having the values of 2 volts and 3 volts, where 3 volts is the threshold for rising edges and 2 volts is the threshold for falling edges which cause the Schmidt trigger 12 to go high and low, respectively. With reference to the timing chart of FIG. 4, the output of the Schmidt trigger 12 is therefore a series of high and low transitions which in effect reconstitutes the synchronized data signal B. However, as an alternative to a Schmidt trigger 12, it is noted that any electronic component can be utilized which has as an output a high data signal when the voltage of its input signal reaches a value substantially above the voltage bias 16, and a low data signal when the input signal reaches a value substantially below the voltage bias.

In addition to the foregoing description, another embodiment of the method and apparatus of the present invention is designed specifically for implementation with the multi-speed bus architecture scheme described in IEEE Standards Document P1394 entitled "High Performance Serial Bus". This document is appended hereto as Appendix A for reference. The bus architecture scheme described in P1394 is intended to provide a multi-speed, serial bus 20 having a low cost, universal interconnection between cards on the same backplane, cards on other backplanes, and external peripherals. It also provides for an arbitrary bus topology where devices or nodes (i.e. addressable devices coupled to the bus having a minimum set of control registers) coupled to the bus 20 need not be arranged in a cyclic network but can be arbitrarily coupled to other device 5 via the serial bus 20 to form an assorted number of network arrangements.

Figure 5:
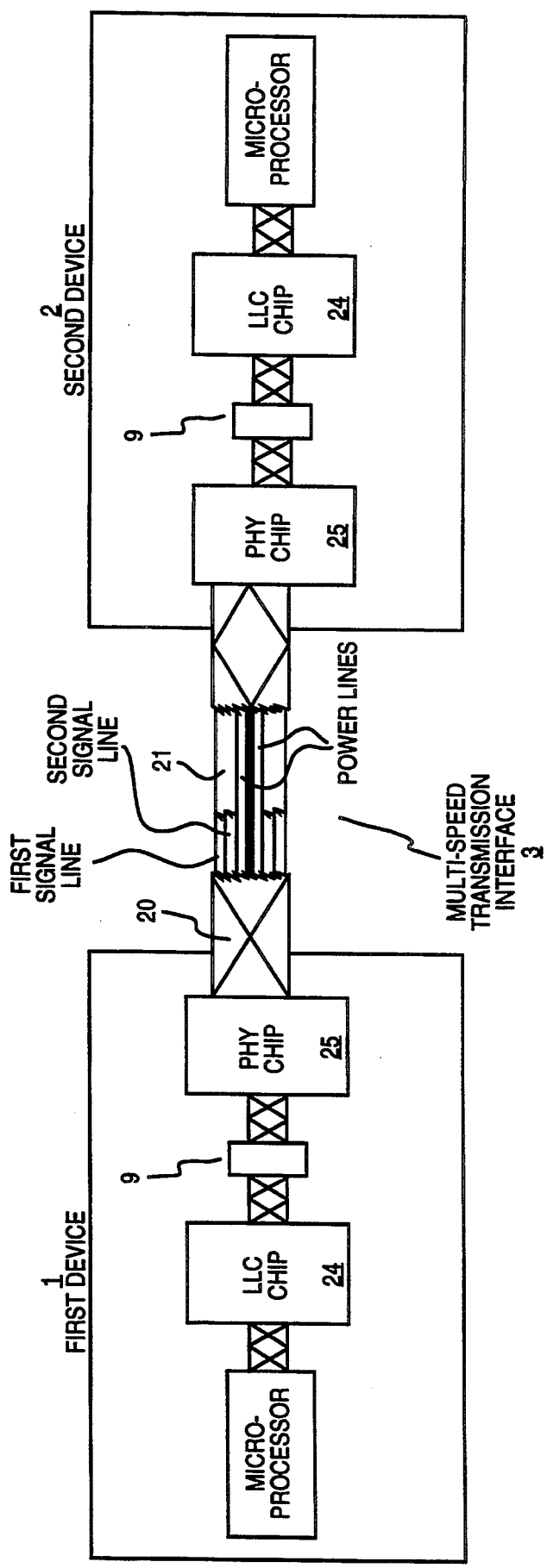
FIG. 5 is a block diagram showing the implementation of the present invention between the LLC and PHY chips pursuant to the IEEE P1394 specification.

In this embodiment, as shown in FIG. 5, the multi-speed serial bus 20 comprising a twisted pair cable 20 is provided for universal interconnection between computer devices arbitrarily configured on the bus. Each device 1 and 2 comprises a physical channel interface chip (or "PHY" chip) 25 directly connected to the serial bus 20 for arbitrating, transmitting, receiving and re-timing of the data signals. Each device similarly comprises a link layer chip (or "LLC" chip) 24 which transmits and receives the data signals at a fixed speed to and from the PHY chip 25 and interfaces with the processing intelligence of the device. The fixed speed transmission between the two chips 24 and 25 is enabled by a conversion process whereby the bus 20 between the two chips 24 and 25 becomes wider (i.e. more transmission channels are used) for faster data signal transmissions. For example, for a 100 Mbit transmission, the bus 20 must be at least two bits wide; for a 200 Mbit transmission, the bus must 20 at least four bits wide; for a 400 Mbit transmission, the bus 20 must be at least eight bits wide; and so on. In this embodiment, the interface 3 of the present invention comprising the isolation barrier 9 is implemented between the PHY and LLC chips 24 and 25 so as to permit the development of a universal interconnection in which a standard serial bus cable 20 can be connected between the PHY chips 25 of adjacent devices 1 and 2.

In this implementation, the signals transmitted are in the form of NRZ data signals which require very broad band transmission capabilities. Due to the fact that a pulse transformer 9 having a narrow band transmission channel is implemented as the isolation barrier 9, it is necessary that the transmitting and receiving circuitry of the PHY and LLC chips 24 and 25 convert the data signals into narrow band data signals for transmission between the PHY and LLC chips 24 and 25. Therefore, according to the method and apparatus of the present invention, the circuitry described above is implemented between the PHY and LLC chips so as to provide a simple method using digital standard cell or gate array technology in a standard digital CMOS process to pass the NRZ data signals across the isolation barrier 9 of the interface 3 disposed between the two chips 24 and 25.

While the present invention has been described in conjunction with the above-embodiments, it is evident that numerous alternatives, depictions, variations and uses will be apparent to those skilled in the art in light of the foregoing description. Specifically, the interface 3 may be uni-directional or bi-directional and may represent the communications channel between two separate devices 1 and 2, two IC chips 24 and 25 or the like. In addition, the isolation barrier 9 coupled to the bus in the interface may comprise a variety of devices or configurations which electrically isolate the transmitting and receiving circuitry of the two devices 1 and 2.

We claim:

1. A method for transmitting an NRZ data signal across an interface between two devices interconnected via a bus, the method comprising the steps of:
   differentiating the data signal with a signal differentiator responsive to a clock signal to produce a differentiated signal;
   supplying the data signal as a first input to a driver comprising a tri-state gate;
   supplying the differentiated signal as a second input to the tri-state gate to enable the tri-state gate when the differentiated signal is high;
   applying a bias voltage to an output of the tri-state gate to derive as output from the tri-state gate a transmission signal for transmission across the interface;
   transmitting the transmission signal across the interface between the two devices; and
   supplying the transmission signal as input to an electronic component having as output a reconstituted data signal comprising
   (1) a high data signal when the input to the electronic component reaches a value substantially above the voltage bias, and
   (2) a low data signal when the input to the electronic component reaches a value substantially below the voltage bias.

2. A method for transmitting an NRZ data signal across an interface comprising an isolation barrier disposed between a first device and a second device interconnected via a bus, the method comprising the steps of:
   differentiating the data signal with a signal differentiator responsive to the clock signal to produce a differentiated signal;
   supplying the data signal as a first input to a driver comprising a tri-state gate;
   supplying the differentiated signal as a second input to the tri-state gate to enable the tri-state gate when the differentiated signal is high;
   applying a bias voltage to an output of the tri-state gate to derive as output from the tri-state gate a transmission signal comprising
   (1) an intermediate transmission signal corresponding to the voltage bias when the tri-state gate is disabled,
   (2) a high transmission signal when the tri-state gate is enabled and the first input to the tri-state gate is high, and
   (3) a low transmission signal when the tri-state gate is enabled and the first input to the tri-state gate is low;
   transmitting the transmission signal derived from the output of the tri-state gate from the first device through the isolation barrier to the second device; and
   supplying the transmission signal to a Schmidt trigger to derive as output from the Schmidt trigger a reconstituted data signal corresponding to the data signal.

3. A method for transmitting an NRZ data signal across an interface comprising an isolation barrier disposed between a first device and a second device interconnected via a bus, the method comprising the steps of:
   synchronizing the data signal with a clock signal;
   supplying the synchronized data signal to a flip-flop responsive to the clock signal to output a delayed synchronized data signal delayed by one clock period;
   supplying the synchronized data signal as a first input to an exclusive OR gate;
   supplying the delayed synchronized data signal as a second input to the exclusive OR gate to output a differentiated signal;
   supplying the synchronized data signal as a first input to a driver comprising a tri-state gate;
   supplying the differentiated signal as a second input to the tri-state gate to enable the tri-state gate when the differentiated signal is high;
   applying a bias voltage to an output of the tri-state gate to derive as output from the tri-state gate a first transmission signal comprising
   (1) an intermediate transmission signal corresponding to the bias voltage when the tri-state gate is disabled,
   (2) a high transmission signal when the tri-state gate is enabled and the first input to the tri-state gate is high, and
   (3) a low transmission signal when the tri-state gate is enabled and the first input to the tri-state gate is low;
   transmitting the first transmission signal derived from the output of the tri-state gate from the first device to the isolation barrier to generate as output from the isolation barrier a second transmission signal electrically isolated from the first transmission signal; and
   transmitting the second transmission signal to a Schmidt trigger having two thresholds to derive as output from the Schmidt trigger a reconstituted data signal corresponding to the synchronized data signal, wherein the bias voltage applied to the output of the tri-state gate sets a DC level of the first and second transmission signals around which a voltage difference between the thresholds of the Schmidt trigger is centered.

4. The method according to claim 3, wherein the step of transmitting the first transmission signal to the isolation barrier further comprises the step of transmitting the first transmission signal through a first blocking capacitor and a first resistor before reception of the first transmission signal by the isolation barrier, and wherein the step of transmitting the second transmission signal to the Schmidt trigger further comprises the step of transmitting the second transmission signal through a second blocking capacitor and a second resistor before reception of the second transmission signal by the Schmidt trigger.

5. An apparatus for transmitting an NRZ data signal across an interface between two devices interconnected via a bus, the apparatus comprising:
   a signal differentiator responsive to a clock signal for receiving the data signal and outputting a differentiated signal;

a driver comprising a tri-state gate having as a first input the data signal, the tri-state gate further having as a second input the differentiated signal for enabling the tri-gate when the differentiated signal is high;

a bias voltage applied to an output of the tri-state gate to derive as output from the tri-state gate a transmission signal for transmission via the bus across the interface between the two devices; and an electronic component for receiving the transmission signal and outputting a reconstituted data signal comprising (1) a high data signal when the input to the electronic component reaches a value substantially above the voltage bias, and (2) a low data signal when the input to the electronic component reaches a value substantially below the voltage bias.

6. An apparatus for transmitting an NRZ data signal across an interface comprising an isolation barrier disposed between a first device and a second device interconnected via a bus, the apparatus comprising:

a first flip-flop responsive to a clock signal for receiving the data signal and outputting a synchronized data signal;

a second flip-flop responsive to the clock signal for receiving the synchronized data signal and outputting a delayed synchronized data signal delayed by one clock period;

an exclusive OR gate for receiving as input the delayed synchronized data signal and the synchronized data signal and outputting a differentiated signal;

a tri-state gate for receiving as a first input the synchronized data signal and receiving as a second input the differentiated signal, the differentiated signal enabling the tri-state gate when the differentiated signal is high;

a bias voltage applied to an output of the tri-state gate for outputting a first transmission signal comprising (1) an intermediate transmission signal corresponding to the bias voltage when the tri-state gate is disabled, (2) a high transmission signal when the tri-state gate is enabled and the first input to the tri-state gate is high, and (3) a low transmission signal when the tri-state gate is enabled and the first input to the tri-state gate is low;

a first blocking capacitor disposed in the bus between the first device and the isolation barrier;

a first resistor disposed in the bus between the first blocking capacitor and the isolation barrier;

the isolation barrier for receiving the first transmission signal and outputting a second transmission signal electrically isolated from the first transmission signal;

a second resistor disposed in the bus between the isolation barrier and the second device;

a second blocking capacitor disposed in the bus between the second resistor and the second device; and a Schmidt trigger for receiving as input the second transmission signal and outputting a reconstituted data signal corresponding to the synchronized data signal.

7. A method for transmitting an NRZ data signal across an interface between two devices interconnected via a bus, the method comprising the steps of:

differentiating the data signal with a signal differentiator responsive to a clock signal to produce a differentiated signal having a first state and a second state;

supplying the data signal as a first input to a driver comprising a tri-state gate;

supplying the differentiated signal as a second input to the tri-state gate to enable the tri-state gate when the differentiated signal is in the first state;

applying a bias voltage to an output of the tri-state gate to derive as output from the tri-state gate a transmission signal for transmission across the interface;

transmitting the transmission signal across the interface between the two devices; and supplying the transmission signal as input to an electronic component having as output a reconstituted data signal comprising (1) a first signal corresponding to a first logic state when the input to the electronic component reaches a value substantially above the voltage bias, and (1) a second signal corresponding to a second logic state when the input to the electronic component reaches a value substantially below the voltage bias.

* * * * *